US012700359B2

(12) United States Patent
Hou et al.

(10) Patent No.: US 12,700,359 B2
(45) Date of Patent: Aug. 4, 2026

(54) PIXEL CIRCUIT, PIXEL DRIVING METHOD, DISPLAY SUBSTRATE, AND DISPLAY DEVICE

(71) Applicants:Chongqing BOE Display Technology Co., Ltd., Chongqing (CN); BOE TECHNOLOGY GROUP CO., LTD., Beijing (CN)

(72) Inventors: Weiwei Hou, Beijing (CN); Qiujie Li, Beijing (CN); Kai Zhang, Beijing (CN); Pei Wang, Beijing (CN); Yu Tian, Beijing (CN); Nanjun Li, Beijing (CN); Daipeng Yao, Beijing (CN)

(73) Assignees: CHONGQING BOE DISPLAY TECHNOLOGY CO., LTD.., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 289 days.

(21) Appl. No.: 18/705,756

(22) PCT Filed: Aug. 9, 2023

(86) PCT No.: PCT/CN2023/111905
§ 371 (c)(1),
(2) Date: Apr. 29, 2024

(87) PCT Pub. No.: WO2024/046066
PCT Pub. Date: Mar. 7, 2024

(65) Prior Publication Data
US 2026/0134829 A1 May 14, 2026

(30) Foreign Application Priority Data
Aug. 30, 2022 (CN) ......................... 202211057035.X

(51) Int. Cl.
G09G 3/3233 (2016.01)
H10K 59/121 (2023.01)
H10K 59/131 (2023.01)

(52) U.S. Cl.
CPC ....... *G09G 3/3233* (2013.01); *H10K 59/1213* (2023.02); *H10K 59/131* (2023.02);
(Continued)

(58) Field of Classification Search
CPC ................... G09G 3/32; G09G 3/3233; G09G 2300/0426; G09G 2300/0819;
(Continued)

(56) References Cited

U.S. PATENT DOCUMENTS

2021/0350740 A1* 11/2021 Byun ................... G09G 3/3233
2021/0366386 A1* 11/2021 Gao ...................... G09G 3/3233
(Continued)

FOREIGN PATENT DOCUMENTS

CN 104680978 A 6/2015
CN 106097964 A 11/2016
(Continued)

*Primary Examiner* — Cory A Almeida
(74) *Attorney, Agent, or Firm* — WHDA, LLP

(57) ABSTRACT

A pixel circuit, a pixel driving method, a display substrate, and a display device are provided. The pixel circuit includes a driving circuit, a first reset circuit, a first node control circuit, a first light-emitting control circuit and a light-emitting element. The first reset circuit writes a first initial voltage to a first electrode of the light-emitting element under control of a potential of the first node. The first node control circuit controls the potential of the first node according to a data voltage and a threshold voltage of the driving transistor included in the driving circuit. The first light-emitting control circuit controls connection between a second end of the driving circuit and the first electrode of the light-emitting element under control of a light-emitting (Continued)

control signal. The driving circuit is configured to generate a driving current.

15 Claims, 12 Drawing Sheets

(52) U.S. Cl.
CPC .............. *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2320/0238* (2013.01)

(58) Field of Classification Search
CPC ... G09G 2300/0842; G09G 2300/0861; G09G 2310/08; G09G 2320/0233; G09G 2320/0238; H10K 59/1213; H10K 59/131
See application file for complete search history.

(56) References Cited

U.S. PATENT DOCUMENTS

| | | | | |
|---|---|---|---|---|
| 2022/0199036 A1* | 6/2022 | Wang | .................. | G09G 3/3266 |
| 2022/0301506 A1* | 9/2022 | Zhang | .................. | G09G 3/3233 |
| 2022/0320232 A1* | 10/2022 | Yang | ...................... | H10K 59/88 |
| 2022/0327998 A1* | 10/2022 | Liu | ....................... | G09G 3/3233 |
| 2022/0352266 A1* | 11/2022 | Yang | ................... | H10K 59/131 |
| 2023/0142259 A1* | 5/2023 | Liu | ...................... | G09G 3/3233 |
| | | | | 345/206 |

FOREIGN PATENT DOCUMENTS

| | | | |
|---|---|---|---|
| CN | 108320709 A | 7/2018 |
| CN | 110808012 A | 2/2020 |
| CN | 111724744 A | 9/2020 |
| CN | 112967653 A | 6/2021 |
| CN | 113299242 A | 8/2021 |
| CN | 115331634 A | 11/2022 |
| KR | 20210084097 A | 7/2021 |

* cited by examiner

1

PIXEL CIRCUIT, PIXEL DRIVING METHOD, DISPLAY SUBSTRATE, AND DISPLAY DEVICE

CROSS-REFERENCE TO RELATED APPLICATIONS

This application is the U.S. national phase of PCT Application PCT/CN2023/111905 filed on Aug. 9, 2023, which claims priority to Chinese Patent Application No. 202211057035.X, filed in China on Aug. 30, 2022, the entire contents of which are incorporated herein by reference.

TECHNICAL FIELD

The present disclosure relates to the technical field of display, and more particularly to a pixel circuit, a pixel driving method, a display substrate, and a display device.

BACKGROUND

In the existing pixel circuits, the weak bright spot phenomenon and the HBM (High Brightness Model) bright spot phenomenon of the black picture often occur due to the characteristic shift of the driving transistor, and the smear phenomenon occurs in the black-bottom white-word picture, which caused by the potential still existing at the anode in the black picture state.

SUMMARY

In an aspect, an embodiment of the present disclosure provides a pixel circuit, comprising a driving circuit, a first reset circuit, a first node control circuit, a first light-emitting control circuit and a light-emitting element; wherein
    a control end of the driving circuit is electrically connected to a first node;
    the first reset circuit is electrically connected to the first node, a first initial voltage line and a first electrode of the light-emitting element, and is configured to write a first initial voltage provided by the first initial voltage line into the first electrode of the light-emitting element under control of a potential of the first node, so as to initialize the first electrode of the light-emitting element;
    the first node control circuit is electrically connected to a data line, the first node, a first end of the driving circuit and a second end of the driving circuit, and is configured to control the potential of the first node according to a data voltage provided by the data line and a threshold voltage of a driving transistor included in the driving circuit;
    the first light-emitting control circuit is electrically connected to a light-emitting control line, a second end of the driving circuit and the first electrode of the light-emitting element, and is configured to control connection between the second end of the driving circuit and the first electrode of the light-emitting element under control of a light-emitting control signal provided by the light-emitting control line;
    the driving circuit is configured to generate a driving current under control of the potential of the first node;
    a second electrode of the light-emitting element is electrically connected to the first voltage line.
    Optionally, the first node control circuit comprises a data writing circuit, a compensation control circuit and a tank circuit;

the data writing circuit is electrically connected to a scanning line, the data line and the first end of the driving circuit, and is configured to write a data voltage provided by the data line into the first end of the driving circuit under control of a scanning signal provided by the scanning line;
    the compensation control circuit is electrically connected to the scanning line, the control end of the driving circuit and the second end of the driving circuit, and is configured to control connection between the control end of the driving circuit and the second end of the driving circuit under control of the scanning signal;
    a first end of the tank circuit is electrically connected to the control end of the driving circuit, a second end of the tank circuit is electrically connected to a second voltage line, and the tank circuit is configured to store electric energy.
    Optionally, the pixel circuit of at least one embodiment of the present disclosure further comprises a second reset circuit;
    the second reset circuit is electrically connected to a reset control line, a second initial voltage line and the control end of the driving circuit, and is configured to provide a second initial voltage provided by the second initial voltage line to the control end of the driving circuit under control of a reset control signal provided by the reset control line, so as to initialize the control end of the driving circuit.
    Optionally, the pixel circuit of at least one embodiment of the present disclosure further comprises a second light-emitting control circuit;
    the second light-emitting control circuit is electrically connected to the light-emitting control line, the second voltage line and the first end of the driving circuit, and is configured to control connection between the first end of the driving circuit and the second voltage line under control of a light-emitting control signal provided by the light-emitting control line;
    the second light-emitting control circuit comprises a sixth transistor,
    a control electrode of the sixth transistor is electrically connected to the light-emitting control line, a first electrode of the sixth transistor is electrically connected to the second voltage line, and a second electrode of the sixth transistor is electrically connected to the first end of the driving circuit.
    Optionally, the first reset circuit comprises a first transistor;
    a control electrode of the first transistor is electrically connected to the first node, a first electrode of the first transistor is electrically connected to the first initial voltage line, and a second electrode of the first transistor is electrically connected to the first electrode of the light-emitting element.
    Optionally, the driving circuit comprises a driving transistor, and the first light-emitting control circuit comprises a second transistor;
    a control electrode of the driving transistor is electrically connected to the first node, a first electrode of the driving transistor is electrically connected to the first end of the driving circuit, and a second electrode of the driving transistor is electrically connected to the second end of the driving circuit;
    a control electrode of the second transistor is electrically connected to the light-emitting control line, a first electrode of the second transistor is electrically connected to the second end of the driving circuit, and a second electrode of the second transistor is electrically connected to the first electrode of the light-emitting element.

Optionally, the data writing circuit comprises a third transistor, and the compensation control circuit comprises a fourth transistor; the tank circuit comprises a first capacitor;

a control electrode of the third transistor is electrically connected to the scanning line, a first electrode of the third transistor is electrically connected to the data line, and a second electrode of the third transistor is electrically connected to the first end of the driving circuit;

a control electrode of the fourth transistor is electrically connected to the scanning line, a first electrode of the fourth transistor is electrically connected to the control end of the driving circuit, and a second electrode of the fourth transistor is electrically connected to the second end of the driving circuit;

a first plate of the first capacitor is electrically connected to the control end of the driving circuit, and a second plate of the first capacitor is electrically connected to the second voltage line.

Optionally, the second reset circuit comprises a fifth transistor;

a control electrode of the fifth transistor is electrically connected to the reset control line, a first electrode of the fifth transistor is electrically connected to the second initial voltage line, and a second electrode of the fifth transistor is electrically connected to a control end of the driving circuit.

In a second aspect, an embodiment of the present disclosure further provides a pixel driving method, applied to the above-mentioned pixel circuit, wherein a display cycle comprises a data writing stage and a display stage arranged successively; the pixel driving method comprises:

in the data writing stage, the data line provides a data voltage, and the first node control circuit controls the potential of the first node according to the data voltage and the threshold voltage of the driving transistor in the driving circuit;

in the display stage, when the data voltage is a data voltage corresponding to a black picture, the first reset circuit writes a first initial voltage to the first electrode of the light-emitting element under control of the potential of the first node to initialize the first electrode of the light-emitting element.

Optionally, the pixel driving method further comprises: when the data voltage is not a data voltage corresponding to a black picture, in the display stage, the first light-emitting control circuit controls connection between the second end of the driving circuit and the first electrode of the light-emitting element under control of the light-emitting control signal provided by the light-emitting control line, and the driving circuit generates a current for driving the light-emitting element under control of the potential of the control end of the driving circuit;

the pixel circuit further comprises a second light-emitting control circuit; the pixel driving method further comprises: a second light-emitting control circuit controls connection between the first end of the driving circuit and the second voltage line under control of the light-emitting control signal.

Optionally, the pixel circuit further comprises a second reset circuit; the display cycle further comprises an initialization stage set before the data writing stage; the pixel driving method further comprises:

in the initialization stage, the second reset circuit provides a second initial voltage provided by the second initial voltage line to the control end of the driving circuit under control of a reset control signal provided by the reset control line to initialize the control end of the driving circuit.

In a third aspect, an embodiment of the present disclosure further provides a display substrate comprising a plurality of rows and columns of pixel circuits as described above disposed on a base substrate.

Optionally, the display substrate comprises a first initial voltage line, a reset control line, a scanning line, a light-emitting control line, a second initial voltage line, a high voltage line and a data line;

the pixel circuit comprises a driving circuit, a first reset circuit, a first node control circuit, a first light-emitting control circuit, a second reset circuit, a second light-emitting control circuit and a first reset circuit; the first node control circuit comprises a compensation control circuit and a data writing circuit;

the first reset circuit comprises a first transistor, the first light-emitting control circuit comprises a second transistor, the data writing circuit comprises a third transistor, the compensation control circuit comprises a fourth transistor, the second reset circuit comprises a fifth transistor, the second light-emitting control circuit comprises a sixth transistor, and the driving circuit comprises a driving transistor;

a first electrode of the first transistor is electrically connected to the first initial voltage line, a control electrode of the second transistor and a control electrode of the sixth transistor are both electrically connected to the light-emitting control line, a control electrode of the third transistor and a control electrode of the fourth transistor are both electrically connected to the scanning line, a control electrode of the fifth transistor is electrically connected to the reset control line, a first electrode of the fifth transistor is electrically connected to the second initial voltage line, and a first electrode of the sixth transistor is electrically connected to the high voltage line;

the first initial voltage line, the reset control line, the scanning line, the light-emitting control line and the second initial voltage line extend along a first direction, and the high voltage line and the data line extend along a second direction;

the first initial voltage line, the reset control line, the scanning line, the light-emitting control line and the second initial voltage line are sequentially arranged along the second direction; the first direction intersects the second direction;

the fourth transistor, the second transistor and the first transistor are sequentially arranged along the second direction;

the fifth transistor and the driving transistor are sequentially arranged along the second direction;

the third transistor and the sixth transistor are sequentially arranged along the second direction;

an orthographic projection of a channel of the third transistor on the base substrate and an orthographic projection of a channel of the sixth transistor on the base substrate are arranged between an orthographic projection of the high voltage line on the base substrate and an orthographic projection of the data line on the base substrate;

an orthographic projection of the gate electrode of the driving transistor on the base substrate is arranged between an orthographic projection of the scanning line on the base substrate and an orthographic projection of the light-emitting control line on the base substrate.

Optionally, the pixel circuit further comprises a first capacitor;

a gate electrode of the driving transistor is reused as a first plate of the first capacitor; the first plate of the first capacitor is formed on a first gate metal layer;

a second plate of the first capacitor is formed on a second gate metal layer;

an orthographic projection of the high voltage line on the base substrate at least partially overlaps with an orthographic projection of a second plate of the first capacitor on the base substrate.

In a fourth aspect, an embodiment of the present disclosure further provides a display device comprising the display substrate described above.

DETAILED DESCRIPTION

The embodiments of the present disclosure will now be described more fully hereinafter with reference to the accompanying drawings, in which some, but not all embodiments of the disclosure are shown. Based on the embodiments in the present disclosure, all other embodiments obtained by a person of ordinary skill in the art without inventive effort fall within the scope of the present disclosure.

The transistors used in all the embodiments of the present disclosure may be thin film transistors or field effect transistors, or other devices with the same characteristics. In embodiments of the present disclosure, to distinguish the two electrodes of a transistor other than the control electrode, one of the electrodes is referred to as a first electrode while the other one is referred to as a second electrode.

In practical operation, when the transistor is a thin film transistor or a field effect transistor, the control electrode may be the gate electrode, the first electrode may be the drain electrode, and the second electrode may be the source electrode; alternatively, the control electrode may be the gate electrode, the first electrode may the source electrode, and the second electrode may be the drain electrode.

Figure 1:
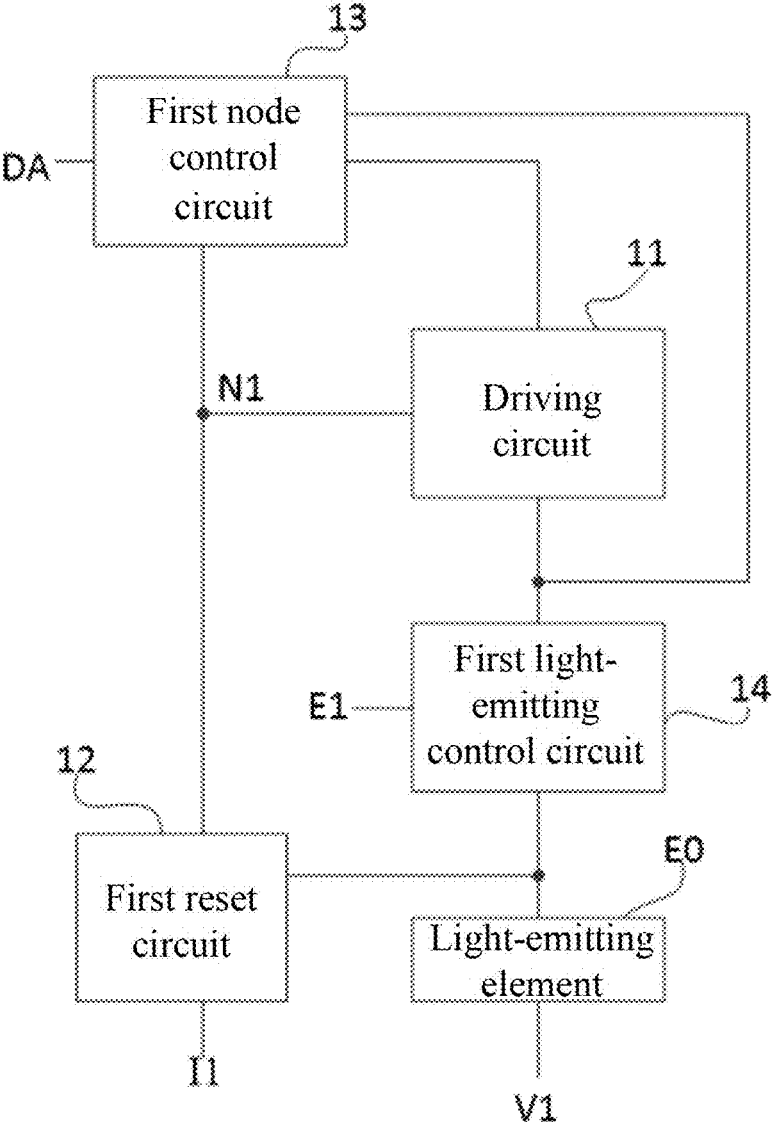
FIG. 1 is a structure diagram of a pixel circuit according to an embodiment of the present disclosure.

As shown in FIG. 1, the pixel circuit of the embodiment of the present disclosure comprises a driving circuit 11, a first reset circuit 12, a first node control circuit 13, a first light-emitting control circuit 14 and a light-emitting element E0;

a control end of the driving circuit 11 is electrically connected to the first node N1;

the first reset circuit 12 is electrically connected to the first node N1, a first initial voltage line I1 and a first electrode of the light-emitting element E0, and is configured to write a first initial voltage Vi1 provided by the first initial voltage line I1 into the first electrode of the light-emitting element E0 under control of the potential of the first node N1, so as to initialize the first electrode of the light-emitting element E0, so that the light-emitting element E0 does not emit light;

the first node control circuit 13 is electrically connected to a data line DA, the first node N1, a first end of the driving circuit 11 and a second end of the driving circuit 11, and is configured to control the potential of the first node N1 according to the data voltage provided by the data line DA and the threshold voltage of the driving transistor included in the driving circuit 11;

the first light-emitting control circuit 14 is electrically connected to a light-emitting control line E1, a second end of the driving circuit 11 and a first electrode of the light-emitting element E0, and is configured to control connection between the second end of the driving circuit 11 and the first electrode of the light-emitting element E0 under control of a light-emitting control signal provided by the light-emitting control line E1;

the driving circuit 11 is electrically connected to the first node N1 and is configured to generate a driving current under control of the potential of the first node N1;

the second electrode of the light-emitting element E0 is electrically connected to the first voltage line V1.

Optionally, the first voltage line may be, but is not limited to, ground or a low voltage line.

When the pixel circuit according to an embodiment of the present disclosure is in operation, the display cycle comprises a data writing stage and a display stage which are arranged successively;

in the data writing stage, the data line DA provides a data voltage Vdata, and the first node control circuit 13 controls the potential of the first node N1 according to the data voltage Vdata and the threshold voltage of the driving transistor in the driving circuit 11;

in the display stage, when the data voltage Vdata is a data voltage corresponding to a black picture, the first reset circuit 12 writes the first initial voltage Vi1 provided by the first initial voltage line I1 into the first electrode of the light-emitting element E0 under control of the potential of the first node N1 so as to initialize the first electrode of the light-emitting element E0, and the light-emitting element E0 does not emit light.

During operation of the pixel circuit according to the embodiment of the present disclosure, the potential of the first node N1 serves as the voltage of the control driving circuit 11 and the first reset circuit 12 at the same time; under a black picture display pattern, the first initial voltage provided by the first initial voltage line I1 is continuously provided to the first electrode of the light-emitting element E0 (the first electrode of the light-emitting element E0 can be an anode), the original black picture display logic is changed, and the first initial voltage is switched to a black picture anode signal; it is possible to avoid a weak bright spot of a black picture and a bright spot of a HBM which occur partly due to a characteristic shift of a driving transistor included in the driving circuit 11, and to provide an efficiency of switching an anode from a high potential to a low potential, and to reduce smear and a part of a smear phenomenon.

The present disclosure can greatly improve the yield, reduce the HBM bright spot phenomenon and improve the picture quality without changing the number and accuracy of processes.

In operation of the pixel circuit according to the embodiment of the present disclosure, when the data voltage is not a data voltage corresponding to a black picture, in the display stage, the first light-emitting control circuit 14 controls connection between the second end of the driving circuit 11 and the first electrode of the light-emitting element E0 under control of the light-emitting control signal provided by the light-emitting control line E1, and the driving circuit 11 generates a current for driving the light-emitting element E0 under control of the potential of the control end of the driving circuit.

In a specific implementation, when the data voltage is not the data voltage corresponding to the black picture, the light-emitting element E0 is driven to emit light by the driving circuit 11 in the display stage.

In the related art, a weak bright point phenomenon and a HBM bright point phenomenon of a driving transistor characteristic deviation occur frequently in a 7T1C pixel circuit, and a smear phenomenon occurs in a black-bottom white-word picture, and these phenomena are caused by a potential existing at an anode in a black picture state, and a short time for initializing the anode before a light-emitting stage affects the picture quality of a light-emitting element black picture, and a phenomenon occurs that a display panel cannot be quickly blacked down. This is because the black picture display logic of the relevant 7T1C pixel circuit is in the anode initialization stage before the light-emitting stage, and after initializing the anode, the anode is kept in a floating state, and it is inevitable that other current factors affect the anode potential.

Figure 2:
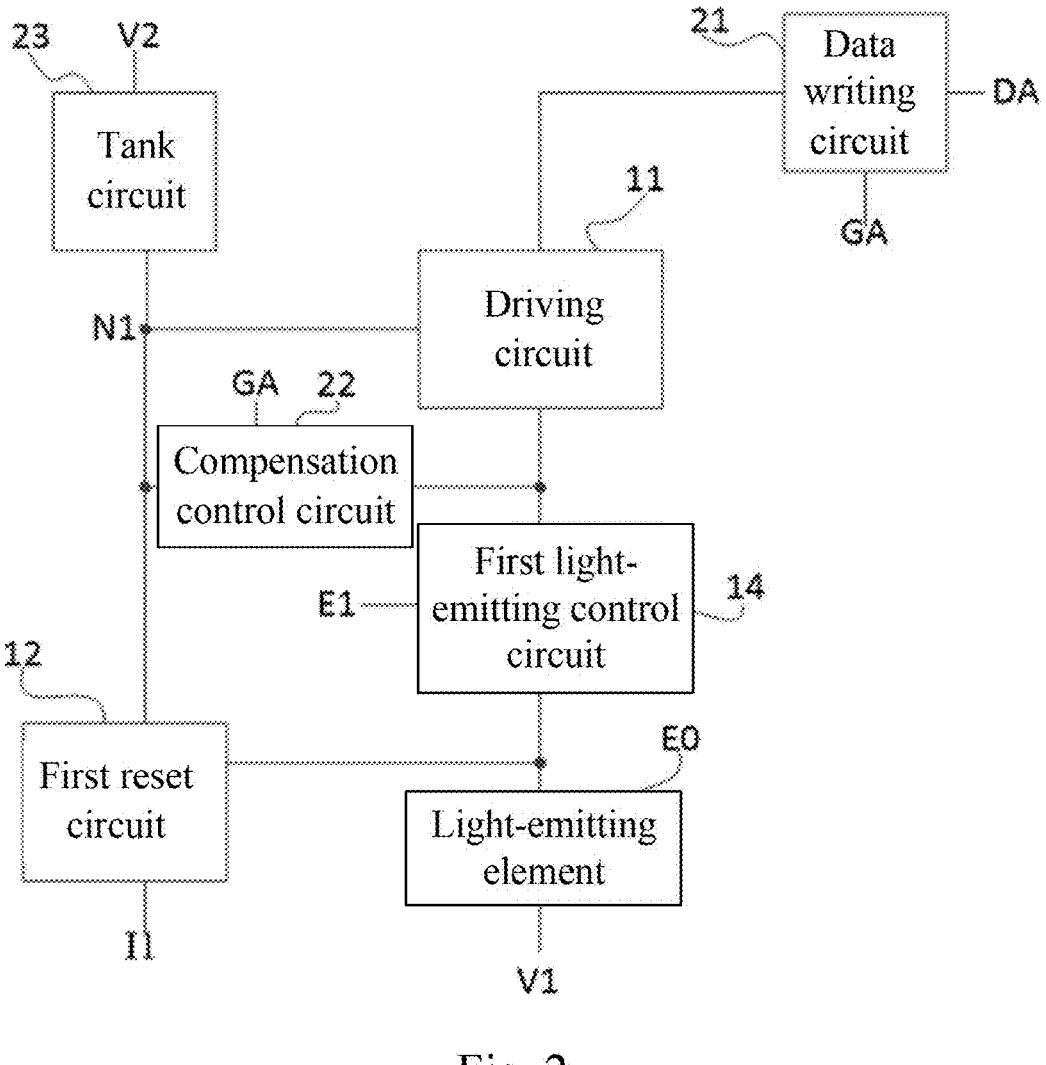
FIG. 2 is a structure diagram of a pixel circuit according to at least one embodiment of the present disclosure.

In at least one embodiment of the present disclosure, as shown in FIG. 2, based on at least one embodiment of the pixel circuit shown in FIG. 1, the first node control circuit comprises a data write circuit 21, a compensation control circuit 22, and a tank circuit 23;

the data writing circuit 21 is electrically connected to a scanning line GA, a data line DA and a first end of the driving circuit 11, and is configured to write a data voltage Vdata provided by the data line DA into the first end of the driving circuit 11 under control of a scanning signal provided by the scanning line GA;

the compensation control circuit 22 is electrically connected to the scanning line GA, the control end of the driving circuit 11 and the second end of the driving circuit 11, and is configured to control connection between the control end of the driving circuit 11 and the second end of the driving circuit 11 under control of the scanning signal;

a first end of the tank circuit 23 is electrically connected to the control end of the driving circuit 11, a second end of the tank circuit 23 is electrically connected to the second voltage line V2, and the tank circuit 23 is configured to store the voltage of the first node N1.

Optionally, the second voltage line may be, but is not limited to, a high voltage line.

Figure 3:
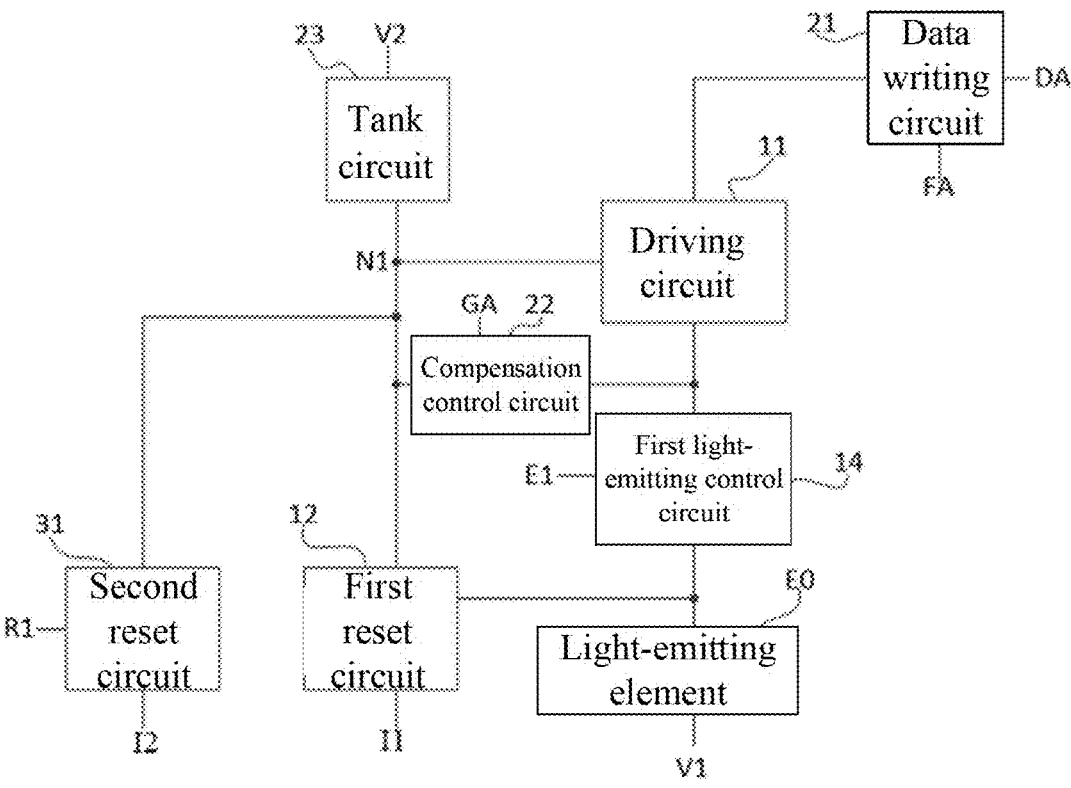
FIG. 3 is a structure diagram of a pixel circuit according to at least one embodiment of the present disclosure.

As shown in FIG. 3, on the basis of the pixel circuit of at least one embodiment shown in FIG. 2, according to at least one embodiment of the present disclosure, the pixel circuit further includes a second reset circuit 31;

the second reset circuit 31 is electrically connected to a reset control line R1, a second initial voltage line I2 and the control end of the driving circuit 11, and is configured to provide a second initial voltage Vi2 provided by the second initial voltage line I2 to the control end of the driving circuit 11 under control of a reset control signal provided by the reset control line R1 so as to initialize the control end of the driving circuit 11.

In operation of at least one embodiment of the pixel circuit of the present disclosure as shown in FIG. 3, the display cycle may further comprise an initialization stage arranged before the data writing stage; the pixel driving method further comprises:

in the initialization stage, the second reset circuit 31, under control of the reset control signal provided by the reset control line R1, provides the second initial voltage Vi2 provided by the second initial voltage line I2 to the control end of the driving circuit 11 to initialize the first node N1, so that the driving circuit 11 can conduct connection between the first end and the second end thereof at the beginning of the data writing stage.

Figure 4:
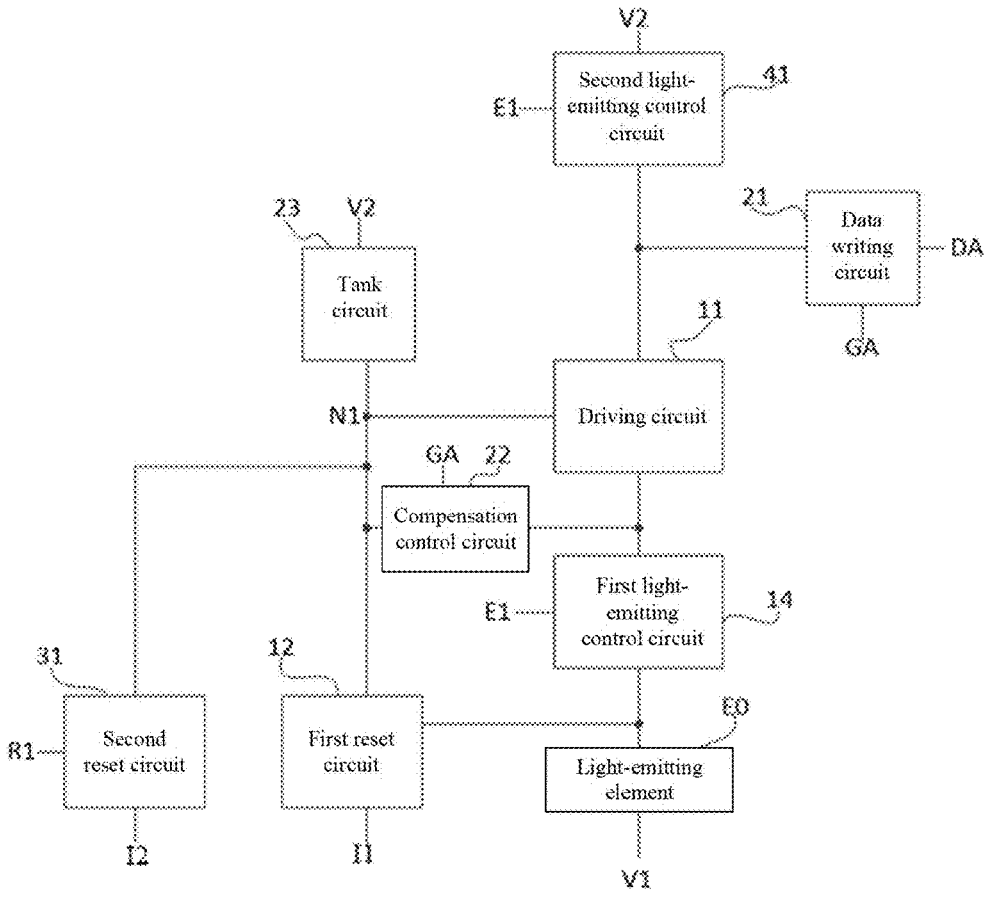
FIG. 4 is a structure diagram of a pixel circuit according to at least one embodiment of the present disclosure.

As shown in FIG. 4, on the basis of at least one embodiment of the pixel circuit shown in FIG. 3, the pixel circuit according to at least one embodiment of the present disclosure further comprises a second light-emitting control circuit 41;

the second light-emitting control circuit 41 is electrically connected to a light-emitting control line E1, a second voltage line V2 and a first end of the driving circuit 11, and is configured to control connection between the first end of the driving circuit 11 and the second voltage line V2 under control of a light-emitting control signal provided by the light-emitting control line E1.

Optionally, the first reset circuit comprises a first transistor;

a control electrode of the first transistor is electrically connected to the first node, a first electrode of the first transistor is electrically connected to the first initial voltage line, and a second electrode of the first transistor is electrically connected to the first electrode of the light-emitting element.

Optionally, the driving circuit comprises a driving transistor, and the first light-emitting control circuit comprises a second transistor;

a control electrode of the driving transistor is electrically connected to the first node, a first electrode of the driving transistor is electrically connected to the first end of the driving circuit, and a second electrode of the driving transistor is electrically connected to the second end of the driving circuit;

a control electrode of the second transistor is electrically connected to the light-emitting control line, a first electrode of the second transistor is electrically connected to the second end of the driving circuit, and a second electrode of the second transistor is electrically connected to the first electrode of the light-emitting element.

Optionally, the data writing circuit comprises a third transistor, and the compensation control circuit comprises a fourth transistor; the tank circuit comprises a first capacitor;

a control electrode of the third transistor is electrically connected to the scanning line, a first electrode of the third transistor is electrically connected to the data line, and a second electrode of the third transistor is electrically connected to the first end of the driving circuit;

a control electrode of the fourth transistor is electrically connected to the scanning line, a first electrode of the fourth transistor is electrically connected to the control end of the driving circuit, and a second electrode of the fourth transistor is electrically connected to the second end of the driving circuit;

a first plate of the first capacitor is electrically connected to the control end of the driving circuit, and a second substrate of the first capacitor is electrically connected to the second voltage line.

Optionally, the second reset circuit comprises a fifth transistor;

a control electrode of the fifth transistor is electrically connected to the reset control line, a first electrode of the fifth transistor is electrically connected to the second initial voltage line, and a second electrode of the fifth transistor is electrically connected to a control end of the driving circuit.

Optionally, the second light-emitting control circuit comprises a sixth transistor;

a control electrode of the sixth transistor is electrically connected to the light-emitting control line, a first electrode of the sixth transistor is electrically connected to the second voltage line, and a second electrode of the sixth transistor is electrically connected to the first end of the driving circuit.

Figure 5:
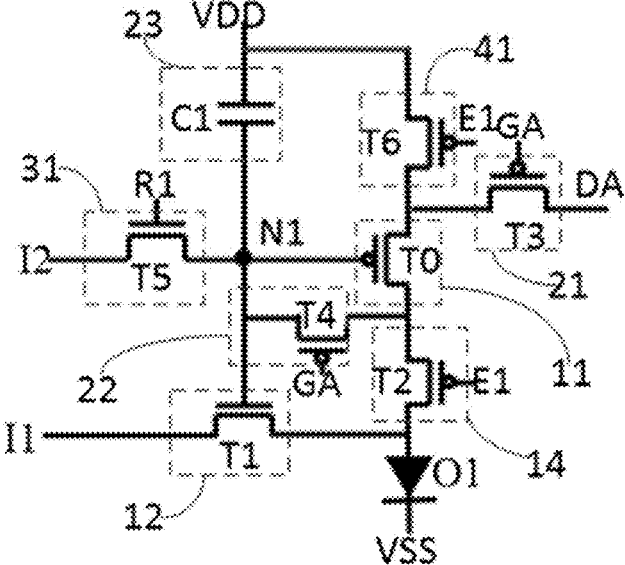
FIG. 5 is a circuit diagram of a pixel circuit according to at least one embodiment of the present disclosure.

As shown in FIG. 5, on the basis of at least one embodiment of the pixel circuit shown in FIG. 4, the first reset circuit 12 comprises a first transistor T1; the light-emitting element is an organic light-emitting diode O1;

a gate electrode of the first transistor T1 is electrically connected to the first node N1, a source electrode of the first transistor T1 is electrically connected to the first initial voltage line I1, and a drain electrode of the first transistor T1 is electrically connected to an anode of the organic light-emitting diode O1;

the driving circuit 11 comprises a driving transistor T0, and the first light-emitting control circuit 14 comprises a second transistor T2;

the gate electrode of the driving transistor T0 is electrically connected to the first node N1;

a gate electrode of the second transistor T2 is electrically connected to the light-emitting control line E1, a source electrode of the second transistor T2 is electrically connected to a drain electrode of the driving transistor T0, and a drain electrode of the second transistor TO is electrically connected to an anode of the organic light-emitting diode O1;

the data writing circuit 21 comprises a third transistor T3, and the compensation control circuit 22 comprises a fourth transistor T4; the tank circuit 23 comprises a first capacitor C1;

a gate electrode of the third transistor T3 is electrically connected to the scanning line GA, a source electrode of the third transistor T3 is electrically connected to the data line DA, and a drain electrode of the third transistor T3 is electrically connected to a source electrode of the driving transistor T0;

the gate electrode of the fourth transistor T4 is electrically connected to the scanning line GA, the source electrode of the fourth transistor T4 is electrically connected to the gate electrode of the driving transistor T0, and the drain electrode of the fourth transistor T4 is electrically connected to the drain electrode of the driving transistor T0;

a first plate of the first capacitor C1 is electrically connected to a gate electrode of the driving transistor T0, and a second plate of the first capacitor C1 is electrically connected to a high voltage line VDD;

the second reset circuit 31 comprises a fifth transistor T5;

a gate electrode of the fifth transistor T5 is electrically connected to the reset control line R1, a source electrode of the fifth transistor T5 is electrically connected to the second initial voltage line I2, and a drain electrode of the fifth transistor T5 is electrically connected to a gate electrode of the driving transistor T0;

the second light-emitting control circuit 41 comprises a sixth transistor T6;

a gate electrode of the sixth transistor T6 is electrically connected to the light-emitting control line E1, a source electrode of the sixth transistor T6 is electrically connected to the high voltage line VDD, and a drain electrode of the sixth transistor T6 is electrically connected to a source electrode of the driving transistor T0;

the cathode of the organic light emitting diode O1 is electrically connected to a low voltage line VSS.

In at least one embodiment shown in FIG. 5, T1 and T5 are N-type transistors and T2, T3, T4, T6 and T0 are P-type transistors.

In at least one embodiment shown in FIG. 5, T1 and T5 may both be oxide transistors, and T2, T3, T4, T6, and T0 may all be LTPS transistors, in which case the pixel circuit shown in FIG. 5 is, but not limited to, an LTPO circuit. In practice, T1 and T5 may be N-type transistors using other channel materials, and T1 and T5 may be low temperature polysilicon transistors as well as other transistors.

Figure 6:
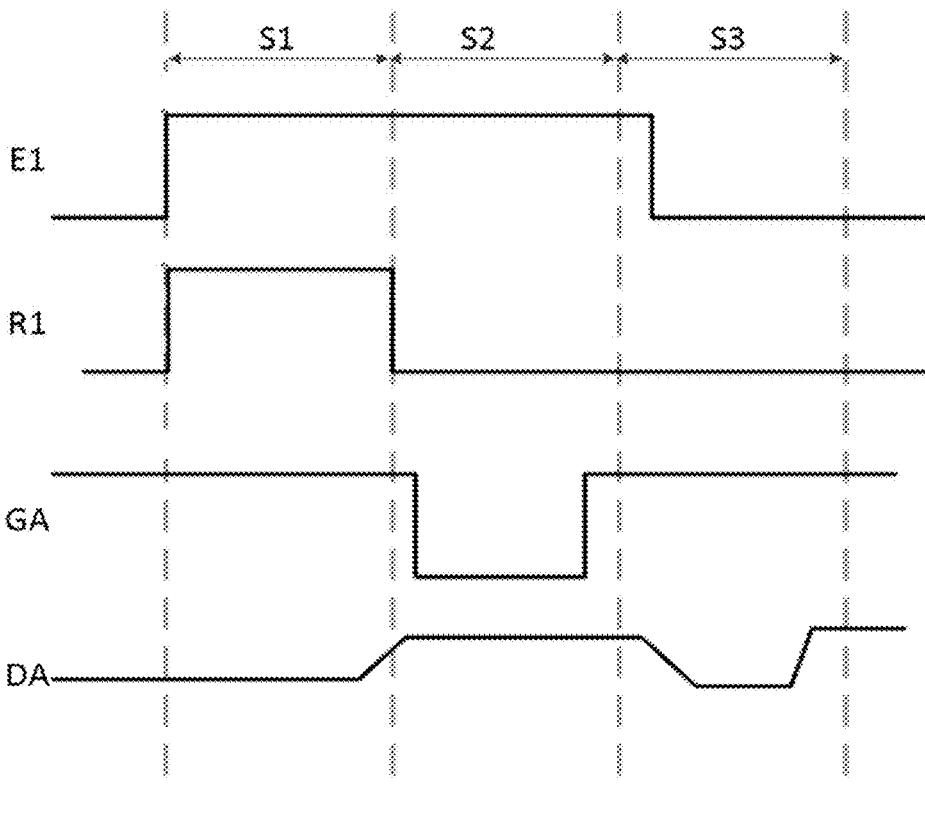
FIG. 6 is an operational timing diagram of at least one embodiment of the pixel circuit shown in FIG. 5 of the present disclosure.

As shown in FIG. 6, in operation of at least one embodiment of the pixel circuit shown in FIG. 5 of the present disclosure, the display cycle may comprise an initialization stage S1, a data writing stage S2 and a display stage S3 arranged successively.

Figure 7:
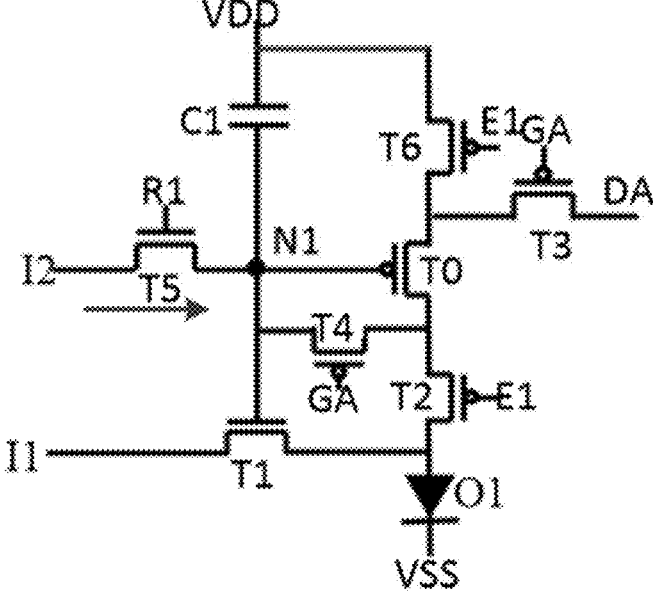
FIG. 7 is a circuit diagram of a pixel circuit according to at least one embodiment of the present disclosure.

In the initialization stage S1, E1 provides a high voltage signal, R1 provides a high voltage signal, GA provides a high voltage signal, and as shown in FIG. 7, T5 is opened to initialize the potential of the first node N1, and I2 provides a −5 V voltage signal to the first node N1; if the previous frame picture is a black picture, it is not necessary to initialize the anode of O1 in the data writing stage S2; if the previous frame picture is in a bright state, and the current frame picture is a black picture, then T1 is controlled to be turned on in the data writing stage S2; at least one embodiment of the present disclosure, compared with the related art, reduces a control object using a reset control signal, and has a certain reduction effect on PNL power consumption.

Figure 8:
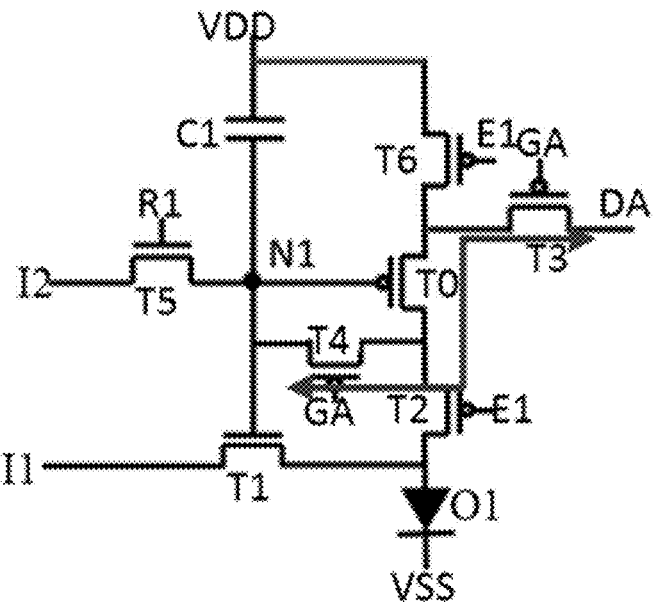
FIG. 8 is a schematic diagram of an operational state of at least one embodiment of the pixel circuit of FIG. 7 of the present disclosure at an initialization stage.

In the data writing stage S2, E1 provides a high voltage signal, R1 provides a low voltage signal, GA provides a low voltage signal, and VDD provides a 1 V voltage signal; as shown in FIG. 8, T4 is opened, and DA provides a data voltage Vdata; when the current frame picture is not a black picture, the voltage of the Vdata is greater than or equal to −2 V and less than or equal to 1 V, and the threshold voltage of T0 is −2.5 V, then at the beginning of the data writing stage S2, T0 is turned on, and C1 is charged via the Vdata so as to raise the potential of N1; until the potential of N1 becomes Vdata+Vth, at this time, the potential of N1 is greater than or equal to −4.5 V but less than or equal to −1.5 V, and T1 remains in a closed state, In the data writing stage S2, E1 provides a high voltage signal, R1 provides a low voltage signal, and GA provides a low voltage signal; when the current frame picture is a black picture, the voltage value of Vdata is 4 V, so that the potential of N1 is maintained at 1.5 V, and I1 provides a −1 V voltage signal, and at the same time, VDD is adjusted to output a 1 V voltage signal, so that T0 can work in a cut-off region; under a black picture, T1 is in a normally-on state.

Figure 9:
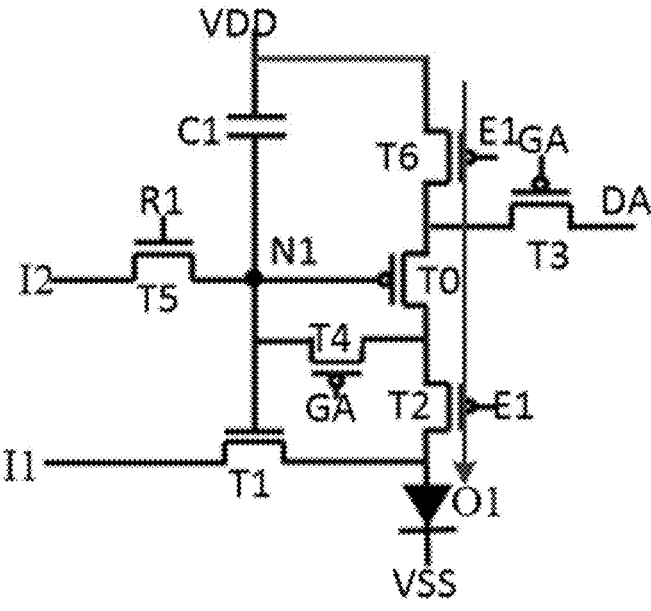
FIG. 9 is a schematic diagram of an operational state of at least one embodiment of the pixel circuit of FIG. 7 of the present disclosure at a data writing stage.

In the display stage S3, E1 provides a low voltage signal, R1 provides a low voltage signal, and GA provides a high voltage signal; when the current frame picture is not a black picture, as shown in FIG. 9, T2 and T6 are opened, T0 drives O1 to emit light, and the driving current for T0 to drive O1 to emit light is $K(\text{Vdata}-\text{Vdd})^2$, wherein K is a current coefficient of T0, and Vdd is a voltage value of the high voltage signal provided by the VDD.

Figure 10:
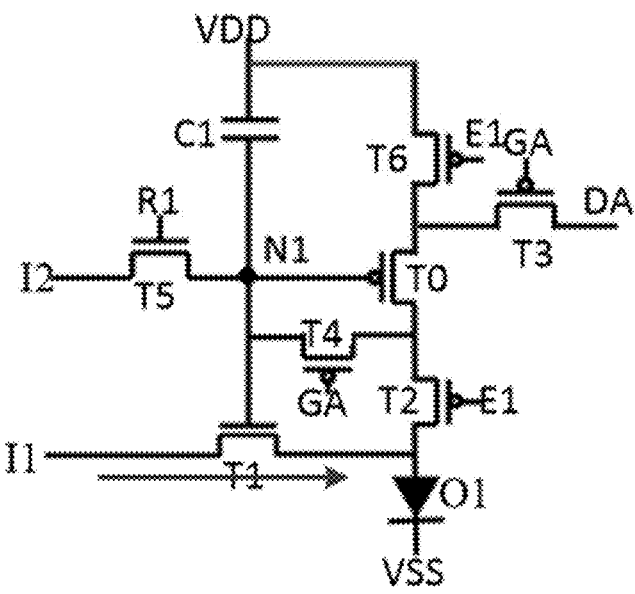
FIG. 10 is a schematic diagram of an operational state of at least one embodiment of the pixel circuit of FIG. 7 of the present disclosure at a display stage.

In the display stage S3, E1 provides a low voltage signal, R1 provides a low voltage signal and GA provides a high voltage signal; when the current frame picture is a black picture, as shown in FIG. 10, T1 is in a normally-on state, T0 is in an off state, and I1 provides a −1 V voltage signal; at this time, the anode potential of O1 is always maintained at −1 V, which greatly reduces the risk of bright spots, and at the same time, the corresponding speed of the picture from bright to dark is improved, and the picture quality is improved.

In at least one embodiment of the present disclosure, the VDD may provide a 1 V voltage signal, but is not so limited.

In FIG. 6, when the light-emitting control signal provided by E1 is a low voltage signal, the potential of the light-emitting control signal may be −6 V; when the light-emitting control signal provided by E1 is a high voltage signal, the potential of the light-emitting control signal may be 6 V.

When the reset control signal provided by R1 is a low voltage signal, the potential of the reset control signal may be −6 V; when the reset control signal provided by R1 is a high voltage signal, the potential of the reset control signal may be 6 V.

When the scanning signal provided by the GA is a low voltage signal, the potential of the scanning signal may be −6 V; when the scanning signal provided by the GA is a high voltage signal, the potential of the scanning signal may be 6 V.

A pixel driving method according to an embodiment of the present disclosure, applied to the above-mentioned pixel circuit, wherein a display cycle comprises a data writing stage and a display stage which are arranged successively; the pixel driving method comprises:

in the data writing stage, the data line provides a data voltage, and the first node control circuit controls the potential of the first node according to the data voltage and the threshold voltage of the driving transistor in the driving circuit;

in the display stage, when the data voltage is a data voltage corresponding to a black picture, the first reset circuit writes a first initial voltage to the first electrode of the light-emitting element under control of the potential of the first node to initialize the first electrode of the light-emitting element so that the light-emitting element does not emit light.

In the pixel driving method according to the embodiment of the present disclosure, the potential of the first node serves as the voltage of the control driving circuit and the first reset circuit at the same time; under a black picture display pattern, the first initial voltage provided by the first initial voltage line is continuously provided to the first electrode of the light-emitting element (the first electrode of the light-emitting element can be an anode); the original black picture display logic is changed; and the first initial voltage is switched to the black picture anode signal, so that the phenomenon of a black picture weak bright point and a HBM bright point occurring partly due to a driving transistor characteristic deviation included in the driving circuit can be avoided. It also provides the efficiency of anode switching from high potential to low potential, reducing smear and part of residual shadow phenomenon.

In an embodiment of the present disclosure, the pixel driving method further comprises: when the data voltage is not a data voltage corresponding to a black picture, in the display stage, the first light-emitting control circuit controls connection between the second end of the driving circuit and the first electrode of the light-emitting element under control of the light-emitting control signal provided by the light-emitting control line, and the driving circuit generates a current for driving the light-emitting element under control of the potential of the control end of the driving circuit.

Optionally, the pixel circuit further comprises a second reset circuit; the display cycle further comprises an initialization stage set before the data writing stage; the pixel driving method further comprises:

in the initialization stage, the second reset circuit provides a second initial voltage provided by the second initial voltage line to the control end of the driving circuit under control of a reset control signal provided by the reset control line to initialize the control end of the driving circuit so that the driving circuit can conduct a connection between a first end and a second end thereof at the beginning of the data writing stage.

In at least one embodiment of the present disclosure, the pixel circuit further comprises a second light-emitting control circuit; the pixel driving method comprises:

a second light-emitting control circuit controls connection between the first end of the driving circuit and the second voltage line under control of the light-emitting control signal.

A display substrate according to an embodiment of the present disclosure includes the above-described multi-row and multi-column pixel circuit disposed on a base substrate.

FIGS. 11-17 are schematic diagrams of a single pixel circuit layout where all transistors in the corresponding pixel circuit of FIG. 5 are low temperature polysilicon transistors. In at least one embodiment of the present disclosure, a display substrate includes a semiconductor layer, a first gate metal layer, a second gate metal layer, a first source and drain metal layer, a second source and drain metal layer, and an anode layer sequentially stacked in a direction away from a base substrate.

In at least one embodiment of the present disclosure, the display substrate comprises a plurality of first initial voltage lines, a plurality of reset control lines, a plurality of scanning lines, a plurality of light-emitting control lines, a plurality of second initial voltage lines, a plurality of high voltage lines and a plurality of data lines; the pixel circuit comprises a driving circuit, a first reset circuit, a first node control circuit, a first light-emitting control circuit, a second reset circuit, a second light-emitting control circuit and a first reset circuit; the first node control circuit comprises a compensation control circuit and a data writing circuit;

the first reset circuit comprises a first transistor, the first light-emitting control circuit comprises a second transistor, the data writing circuit comprises a third transistor, the compensation control circuit comprises a fourth transistor, the second reset circuit comprises a fifth transistor, the second light-emitting control circuit comprises a sixth transistor, and the driving circuit comprises a driving transistor;

a first electrode of the first transistor is electrically connected to the first initial voltage line, a control electrode of the second transistor and a control electrode of the sixth transistor are both electrically connected to the light-emitting control line, a control electrode of the third transistor and a control electrode of the fourth transistor are both electrically connected to the scanning line, a control electrode of the fifth transistor is electrically connected to the reset control line, a first electrode of the fifth transistor is electrically connected to the second initial voltage line, and a first electrode of the sixth transistor is electrically connected to the high voltage line;

the first initial voltage line, the reset control line, the scanning line, the light-emitting control line and the second initial voltage line extend along a first direction, and the high voltage line and the data line extend along a second direction;

the first initial voltage line, the reset control line, the scanning line, the light-emitting control line and the second initial voltage line are sequentially arranged along the second direction; the first direction intersects the second direction;

the fourth transistor, the second transistor and the first transistor are sequentially arranged along the second direction;

the fifth transistor and the driving transistor are sequentially arranged along the second direction;

the third transistor and the sixth transistor are sequentially arranged along the second direction;

an orthographic projection of a channel of the third transistor on the base substrate and an orthographic projection of a channel of the sixth transistor on the base substrate are arranged between an orthographic projection of the high voltage line on the base substrate and an orthographic projection of the data line on the base substrate;

an orthographic projection of the gate electrode of the driving transistor on the base substrate is arranged between an orthographic projection of the scanning line on the base substrate and an orthographic projection of the light-emitting control line on the base substrate.

In at least one embodiment of the present disclosure, the control electrode may be a gate electrode, each of the transistors comprising a gate electrode and an active layer, the active layer comprising a channel region, a source electrode and a drain electrode; the active layer of the first transistor, the active layer of the second transistor, the active layer of the third transistor, the active layer of the fourth transistor, the active layer of the fifth transistor and the active layer of the sixth transistor are located on the semiconductor layer, and the gate electrode is located on the first gate metal layer.

In at least one embodiment of the present disclosure, the pixel circuit further comprises a first capacitor;

a gate electrode of the driving transistor is reused as a first plate of the first capacitor; the first plate of the first capacitor is formed on a first gate metal layer;

a second plate of the first capacitor is formed on a second gate metal layer;

an orthographic projection of the high voltage line on the base substrate at least partially overlaps with an orthographic projection of a second plate of the first capacitor on the base substrate.

Figure 11:
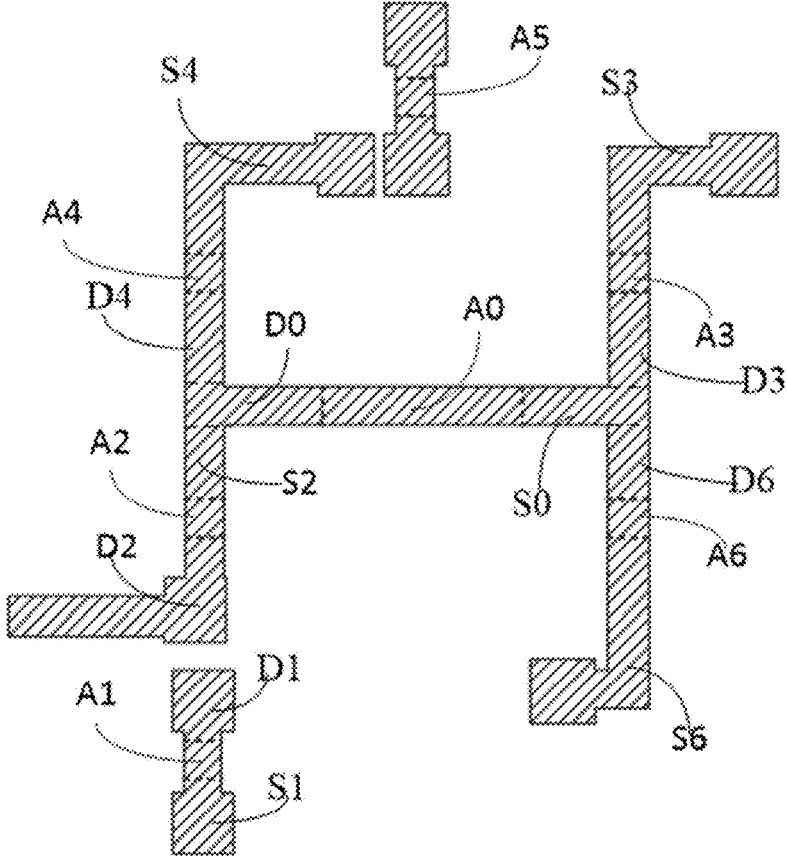
FIG. 11 is a layout diagram of a semiconductor layer in FIG. 17.
Figure 12:
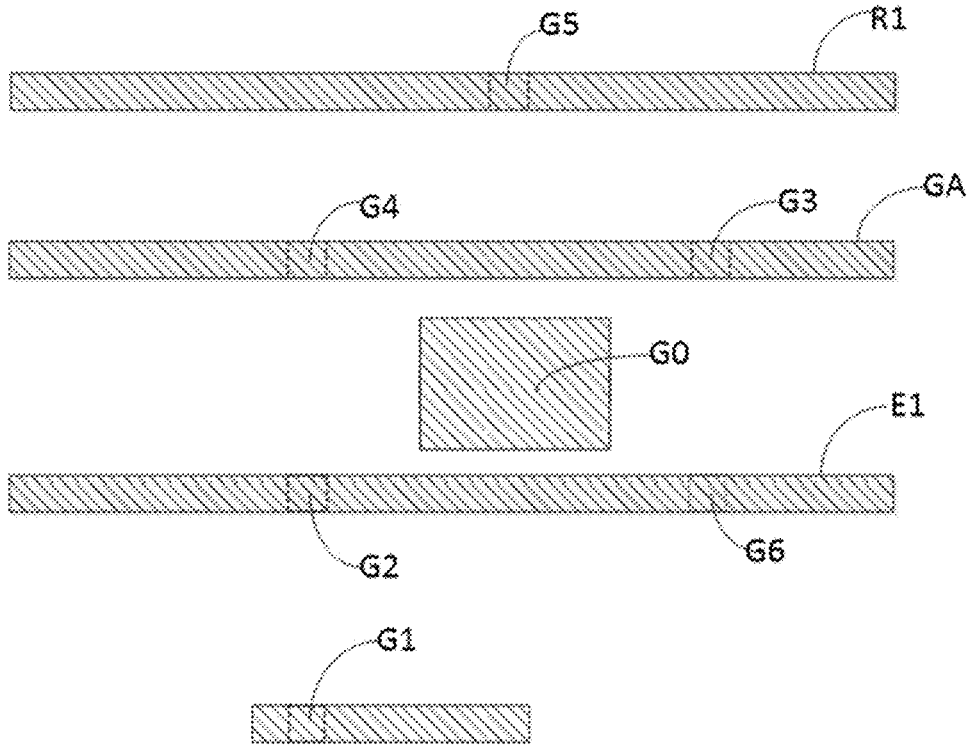
FIG. 12 is a layout diagram of a first gate metal layer of FIG. 17.
Figure 13:
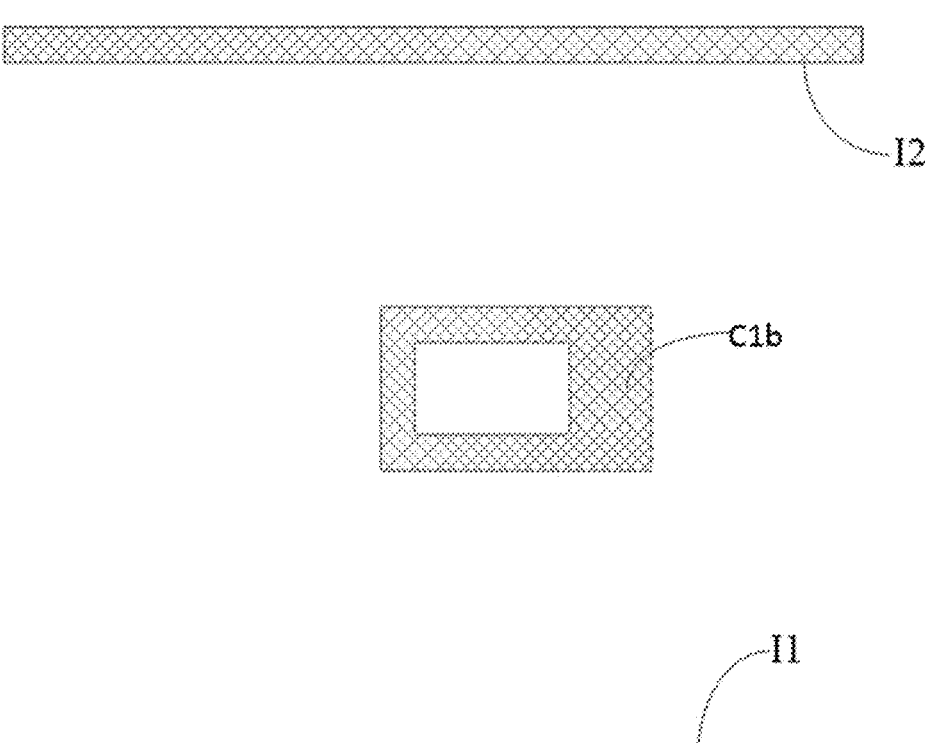
FIG. 13 is a layout diagram of a second gate metal layer of FIG. 17.
Figure 14:
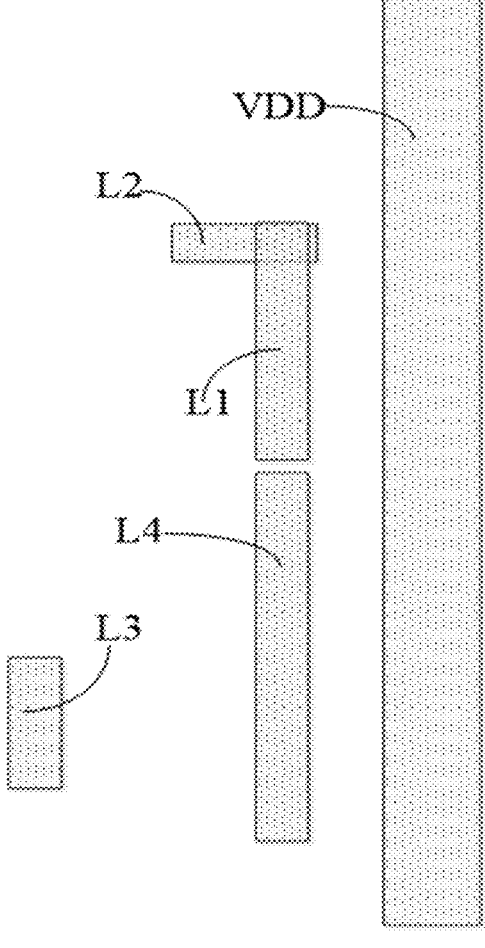
FIG. 14 is a layout diagram of a first source and drain metal layer of FIG. 17.
Figure 15:
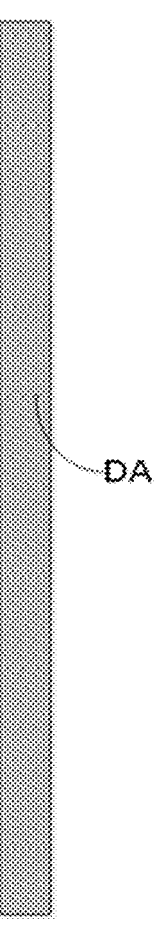
FIG. 15 is a layout diagram of a second source and drain metal layer of FIG. 17.
Figure 16:
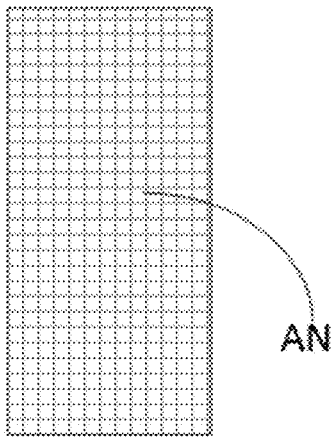
FIG. 16 is a layout diagram of an anode layer of FIG. 17.
Figure 17:
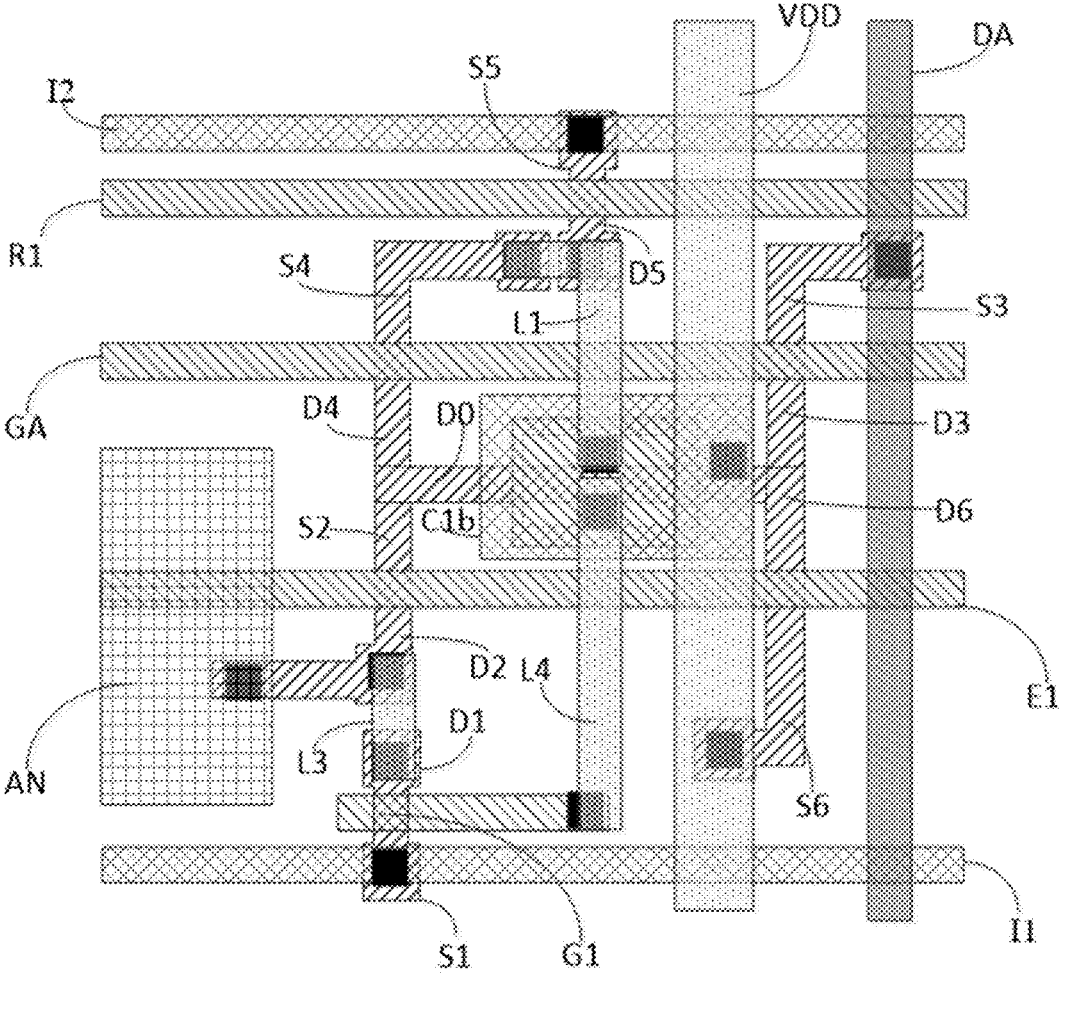
FIG. 17 is a layout diagram of at least one embodiment of the corresponding pixel circuit of FIG. 5.

FIG. 11 is a layout diagram of the semiconductor layer of FIG. 17, FIG. 12 is a layout diagram of the first gate metal layer of FIG. 17, FIG. 13 is a layout diagram of the second gate metal layer of FIG. 17, FIG. 14 is a layout diagram of the first source and drain metal layer of FIG. 17, FIG. 15 is a layout diagram of the second source and drain metal layer of FIG. 17, FIG. 16 is a layout diagram of the anode layer of FIG. 17, and FIG. 17 is a layout diagram of at least one embodiment of the corresponding pixel circuit of FIG. 5.

In FIG. 11, the channel labeled A0 is the channel T0, the channel labeled A1 is the channel T1, the channel labeled A2 is the channel T2, the channel labeled A3 is the channel T3, the channel labeled A4 is the channel T4, the channel labeled A5 is the channel T5, and the channel labeled A6 is the channel T6.

In FIG. 12, the reference numeral R1 denotes a reset control line, the reference numeral GA denotes a scanning line, the reference numeral E1 denotes a light-emitting control line, the reference numeral G0 denotes a gate electrode of T0, the reference numeral G1 denotes a gate electrode of T1, the reference numeral G2 denotes a gate electrode of T2, the reference numeral G3 denotes a gate electrode of T3, the reference numeral G4 denotes a gate electrode of T4, the reference numeral G5 denotes a gate electrode of T5, and the reference numeral G6 denotes a gate electrode of T6; G0 is reused as the first plate of C1.

As shown in FIG. 12, the part where the reset control line R1 overlaps with the semiconductor layer is the gate electrode G5 of the fifth transistor, the parts where the scanning line GA overlaps with the semiconductor layer are the gate electrode G4 of the fourth transistor and the gate electrode G3 of the third transistor respectively, and the parts where the light-emitting control line E1 overlaps with the semiconductor layer are the gate electrode G2 of the second transistor and the gate electrode G6 of the sixth transistor respectively.

In FIG. 13, the reference numeral I1 denotes a first initial voltage line, the reference numeral I2 denotes a second initial voltage line, and the reference numeral C1b denotes a second plate of C1.

In FIG. 14, the reference numeral VDD denotes a high voltage line, the reference numeral L1 denotes a first conductive connection part, the reference numeral L2 denotes a second conductive connection part, the reference numeral L3 denotes a third conductive connection part, and the reference numeral L4 denotes a fourth conductive connection part.

In FIG. 15, the data DA is the data line.

In FIG. 16, labeled AN is the anode of the organic light emitting diode.

As shown in FIGS. 11-17, a first initial voltage line I1, a second initial voltage line I2, a reset control line R1, a scanning line GA and a light-emitting control line E1 all extend in a horizontal direction; VDD and DA extend in a vertical direction;

I1, R1, GA, E1 and I2 are arranged successively in the vertical direction;

T4, T2 and T1 are sequentially arranged in the vertical direction;

T5 and T0 are sequentially arranged in the vertical direction;

T3 and T6 are sequentially arranged in the vertical direction;

the orthographic projection of the channel of T3 on the base substrate and the orthographic projection of the channel of T6 on the base substrate are arranged between the orthographic projection of the high voltage line VDD on the base substrate and the orthographic projection of the data line DA on the base substrate;

the orthographic projection of the gate electrode G0 of T0 on the base substrate is arranged between the orthographic projection of the scanning line GA on the base substrate and the orthographic projection of the light-emitting control line E1 on the base substrate.

In at least one embodiment of the present disclosure, the pixel circuit further comprises a first capacitor;

the gate electrode G0 of the driving transistor T0 is reused as a first plate of the first capacitor; an electrode plate of the first capacitor is formed on the first gate metal layer;

a second plate C1b of the first capacitor is formed on a second gate metal layer;

the orthographic projection of the high voltage line VDD on the base substrate and the orthographic projection of the second plate C1b of the first capacitor on the base substrate at least partially overlap to reduce the space laterally occupied by the pixel circuit.

In FIG. 11 and FIG. 17, the reference numeral S5 denotes a source electrode of T5, the reference numeral D5 denotes a drain electrode of T5, the reference numeral S4 denotes a source electrode of T4, the reference numeral D4 denotes a drain electrode of T4, the reference numeral S2 denotes a source electrode of T2, the reference numeral D2 denotes a drain electrode of T2, the reference numeral D1 denotes a drain electrode of T1, the reference numeral S1 denotes a source electrode of T1, the reference numeral S5 denotes a source electrode of T5, the reference numeral D5 denotes a drain electrode of T5, the reference numeral S3 denotes a source electrode of T3, the reference numeral D3 denotes a drain electrode of T3, the reference numeral D6 denotes a source electrode of T6; the reference numeral S6 denotes a source electrode of T6; the reference numeral DO denotes a drain electrode of T0.

In FIG. 11, the reference numeral S0 denotes a source electrode of T0.

As shown in FIGS. 11-17, S5 is electrically connected to I2 via a via hole, and D5 is electrically connected to a first conductive connection part L1 via the via hole, and the first conductive connection part L1 is electrically connected to a gate electrode G0 of a driving transistor T0 via the via hole;

S4 is electrically connected to the second conductive connection part L2 via a via hole, and the second conductive connection part L2 is in communication with the first conductive connection part L1;

D4, S2 and D0 are in communication with each other;

D2 is electrically connected to the anode AN of O1 via a via hole; D2 is electrically connected to the third conductive connection part L3 via a via hole; the third conductive connection part L3 is electrically connected to D1 via a via hole, so that D1 and D2 are electrically connected;

S1 is electrically connected to the first initial voltage line I1 via a via hole; G1 is electrically connected to the fourth conductive connection part L4 via a via hole, and L4 is electrically connected to the gate electrode G0 of the driving transistor T0 via the via hole;

S3 is electrically connected to the data line DA via a via hole, and D3, D6 and S0 are in communication;

S6 is electrically connected to the high voltage line VDD via a via hole;

the second plate C1b of C1 is electrically connected to the high voltage line VDD through a via hole.

A display device according to an embodiment of the present disclosure includes the display substrate described above.

The display device provided by the embodiments of the present disclosure may be a mobile phone, a tablet computer, a television, a display, a notebook computer, a digital photo frame, a navigator, or any product or component with display functions.

While the foregoing is directed to the preferred embodiments of the present disclosure, it will be understood by those skilled in the art that numerous modifications and adaptations may be made without departing from the principles of the disclosure, and such modifications and adaptations are intended to be within the scope of the disclosure.

What is claimed is:

1. A pixel circuit, comprising: a driving circuit, a first reset circuit, a first node control circuit, a first light-emitting control circuit and a light-emitting element;

wherein a control end of the driving circuit is electrically connected to a first node;

the first reset circuit is directly electrically connected to the first node and the driving circuit, and is electrically connected to a first initial voltage line and a first electrode of the light-emitting element, and is configured to write a first initial voltage provided by the first initial voltage line into the first electrode of the light-emitting element under control of a potential of the first node, to initialize the first electrode of the light-emitting element;

the first node control circuit is electrically connected to a data line, the first node, a first end of the driving circuit and a second end of the driving circuit, and is configured to control the potential of the first node according to a data voltage provided by the data line and a threshold voltage of a driving transistor included in the driving circuit;

the first light-emitting control circuit is electrically connected to a light-emitting control line, a second end of the driving circuit and the first electrode of the light-emitting element, and is configured to control connection between the second end of the driving circuit and the first electrode of the light-emitting element under control of a light-emitting control signal provided by the light-emitting control line;

the driving circuit is configured to generate a driving current under control of the potential of the first node; and a second electrode of the light-emitting element is electrically connected to the first voltage line.

2. The pixel circuit according to claim 1, wherein the first node control circuit comprises a data writing circuit, a compensation control circuit and a tank circuit;

the data writing circuit is electrically connected to a scanning line, the data line and the first end of the driving circuit, and is configured to write a data voltage provided by the data line into the first end of the driving circuit under control of a scanning signal provided by the scanning line;

the compensation control circuit is electrically connected to the scanning line, the control end of the driving circuit and the second end of the driving circuit, and is configured to control connection between the control end of the driving circuit and the second end of the driving circuit under control of the scanning signal; and a first end of the tank circuit is electrically connected to the control end of the driving circuit, a second end of the tank circuit is electrically connected to a second voltage line, and the tank circuit is configured to store electric energy.

3. The pixel circuit according to claim 2, wherein the data writing circuit comprises a third transistor, and the compensation control circuit comprises a fourth transistor; the tank circuit comprises a first capacitor;

a control electrode of the third transistor is electrically connected to the scanning line, a first electrode of the third transistor is electrically connected to the data line, and a second electrode of the third transistor is electrically connected to the first end of the driving circuit;

a control electrode of the fourth transistor is electrically connected to the scanning line, a first electrode of the fourth transistor is electrically connected to the control end of the driving circuit, and a second electrode of the fourth transistor is electrically connected to the second end of the driving circuit; and a first plate of the first capacitor is electrically connected to the control end of the driving circuit, and a second plate of the first capacitor is electrically connected to the second voltage line.

4. The pixel circuit according to claim 1, further comprising a second reset circuit, wherein the second reset circuit is electrically connected to a reset control line, a second initial voltage line and a control end of the driving circuit, and is configured to provide a second initial voltage provided by the second initial voltage line to the control end of the driving circuit under control of a reset control signal provided by the reset control line.

5. The pixel circuit according to claim 4, wherein the second reset circuit comprises a fifth transistor; and a control electrode of the fifth transistor is electrically connected to the reset control line, a first electrode of the fifth transistor is electrically connected to the second initial voltage line, and a second electrode of the fifth transistor is electrically connected to a control end of the driving circuit.

6. The pixel circuit according to claim 1, further comprising a second light-emitting control circuit;

the second light-emitting control circuit is electrically connected to the light-emitting control line, the second voltage line and the first end of the driving circuit, and is configured to control connection between the first end of the driving circuit and the second voltage line under control of a light-emitting control signal provided by the light-emitting control line;

the second light-emitting control circuit comprises a sixth transistor; and a control electrode of the sixth transistor is electrically connected to the light-emitting control line, a first electrode of the sixth transistor is electrically connected to the second voltage line, and a second electrode of the sixth transistor is electrically connected to the first end of the driving circuit.

7. The pixel circuit according to claim 1, wherein the first reset circuit comprises a first transistor; and a control electrode of the first transistor is electrically connected to the first node, a first electrode of the first transistor is electrically connected to the first initial voltage line, and a second electrode of the first transistor is electrically connected to the first electrode of the light-emitting element.

8. The pixel circuit according to claim 1, wherein the driving circuit comprises a driving transistor, and the first light-emitting control circuit comprises a second transistor;

a control electrode of the driving transistor is electrically connected to the first node, a first electrode of the driving transistor is electrically connected to the first end of the driving circuit, and a second electrode of the driving transistor is electrically connected to the second end of the driving circuit; and a control electrode of the second transistor is electrically connected to the light-emitting control line, a first electrode of the second transistor is electrically connected to the second end of the driving circuit, and a second electrode of the second transistor is electrically connected to the first electrode of the light-emitting element.

9. A display device comprising a display substrate as claimed in claim 1.

10. A pixel driving method, applied to a pixel circuit wherein the pixel circuit comprises:

a driving circuit, a first reset circuit, a first node control circuit, a first light-emitting control circuit and a light-emitting element;

wherein a control end of the driving circuit is electrically connected to a first node:

the first reset circuit is directly electrically connected to the first node and the driving circuit, and is electrically connected to a first initial voltage line and a first electrode of the light-emitting element, and is configured to write a first initial voltage provided by the first initial voltage line into the first electrode of the light-emitting element under control of a potential of the first node, to initialize the first electrode of the light-emitting element;

the first node control circuit is electrically connected to a data line, the first node, a first end of the driving circuit and a second end of the driving circuit, and is configured to control the potential of the first node according to a data voltage provided by the data line and a threshold voltage of a driving transistor included in the driving circuit:

the first light-emitting control circuit is electrically connected to a light-emitting control line, a second end of the driving circuit and the first electrode of the light-emitting element and is configured to control connection between the second end of the driving circuit and the first electrode of the light-emitting element under control of a light-emitting control signal provided by the light-emitting control line;

the driving circuit is configured to generate a driving current under control of the potential of the first node; and a second electrode of the light-emitting element is electrically connected to the first voltage line;

wherein a display cycle comprises a data writing stage and a display stage which are arranged successively; the pixel driving method comprises:

in the data writing stage, the data line provides a data voltage, and the first node control circuit controls the potential of the first node according to the data voltage and the threshold voltage of the driving transistor in the driving circuit; and in the display stage, when the data voltage is a data voltage corresponding to a black picture, the first reset circuit writes a first initial voltage to the first electrode of the light-emitting element under control of the potential of the first node to initialize the first electrode of the light-emitting element.

11. The pixel driving method according to claim 10, wherein the pixel driving method further comprises: when the data voltage is not a data voltage corresponding to a black picture, in the display stage, the first light-emitting control circuit controls connection between the second end of the driving circuit and the first electrode of the light-emitting element under control of the light-emitting control signal provided by the light-emitting control line, and the driving circuit generates a current for driving the light-emitting element under control of the potential of the control end of the driving circuit; and the pixel circuit further comprises a second light-emitting control circuit; the pixel driving method further comprises: a second light-emitting control circuit controls connection between the first end of the driving circuit and the second voltage line under control of the light-emitting control signal.

12. The pixel driving method according to claim 10, wherein the pixel circuit further comprises a second reset circuit; the display cycle further comprises an initialization stage set before the data writing stage; the pixel driving method further comprises:

in the initialization stage, the second reset circuit provides a second initial voltage provided by the second initial voltage line to the control end of the driving circuit under control of a reset control signal provided by the reset control line to initialize the control end of the driving circuit.

13. A display substrate comprising a plurality of rows and columns of pixel circuits disposed on a base substrate;

wherein each of the pixel circuits comprises:

a driving circuit, a first reset circuit, a first node control circuit, a first light-emitting control circuit and a light-emitting element;

wherein a control end of the driving circuit is electrically connected to a first node;

the first reset circuit is directly electrically connected to the first node and the driving circuit, and is electrically connected to a first initial voltage line and a first electrode of the light-emitting element, and is configured to write a first initial voltage provided by the first initial voltage line into the first electrode of the light-emitting element under control of a potential of the first node, to initialize the first electrode of the light-emitting element;

the first node control circuit is electrically connected to a data line, the first node, a first end of the driving circuit and a second end of the driving circuit, and is configured to control the potential of the first node according to a data voltage provided by the data line and a threshold voltage of a driving transistor included in the driving circuit;

the first light-emitting control circuit is electrically connected to a light-emitting control line, a second end of the driving circuit and the first electrode of the light-emitting element, and is configured to control connection between the second end of the driving circuit and the first electrode of the light-emitting element under control of a light-emitting control signal provided by the light-emitting control line;

the driving circuit is configured to generate a driving current under control of the potential of the first node; and a second electrode of the light-emitting element is electrically connected to the first voltage line.

14. The display substrate according to claim 13, wherein the display substrate comprises a first initial voltage line, a reset control line, a scanning line, a light-emitting control line, a second initial voltage line, a high voltage line and a data line;

the pixel circuit comprises a driving circuit, a first reset circuit, a first node control circuit, a first light-emitting control circuit, a second reset circuit, a second light-emitting control circuit and a first reset circuit; the first node control circuit comprises a compensation control circuit and a data writing circuit;

the first reset circuit comprises a first transistor, the first light-emitting control circuit comprises a second transistor, the data writing circuit comprises a third transistor, the compensation control circuit comprises a fourth transistor, the second reset circuit comprises a fifth transistor, the second light-emitting control circuit comprises a sixth transistor, and the driving circuit comprises a driving transistor;

a first electrode of the first transistor is electrically connected to the first initial voltage line, a control electrode of the second transistor and a control electrode of the sixth transistor are both electrically connected to the light-emitting control line, a control electrode of the third transistor and a control electrode of the fourth transistor are both electrically connected to the scanning line, a control electrode of the fifth transistor is electrically connected to the reset control line, a first electrode of the fifth transistor is electrically connected to the second initial voltage line, and a first electrode of the sixth transistor is electrically connected to the high voltage line;

the first initial voltage line, the reset control line, the scanning line, the light-emitting control line and the second initial voltage line extend along a first direction, and the high voltage line and the data line extend along a second direction;

the first initial voltage line, the reset control line, the scanning line, the light-emitting control line and the second initial voltage line are sequentially arranged along the second direction; the first direction intersects the second direction;

the fourth transistor, the second transistor and the first transistor are sequentially arranged along the second direction;

the fifth transistor and the driving transistor are sequentially arranged along the second direction;

the third transistor and the sixth transistor are sequentially arranged along the second direction;

an orthographic projection of a channel of the third transistor on the base substrate and an orthographic projection of a channel of the sixth transistor on the base substrate are arranged between an orthographic projection of the high voltage line on the base substrate and an orthographic projection of the data line on the base substrate; and an orthographic projection of the gate electrode of the driving transistor on the base substrate is arranged between an orthographic projection of the scanning line on the base substrate and an orthographic projection of the light-emitting control line on the base substrate.

15. The display substrate according to claim 14, wherein the pixel circuit further comprises a first capacitor;

a gate electrode of the driving transistor is reused as a first plate of the first capacitor; the first plate of the first capacitor is formed on a first gate metal layer;

a second plate of the first capacitor is formed on a second gate metal layer; and an orthographic projection of the high voltage line on the base substrate at least partially overlaps with an orthographic projection of a second plate of the first capacitor on the base substrate.

* * * * *